United States Patent [19]

Wilson

[11] Patent Number: 5,504,484
[45] Date of Patent: Apr. 2, 1996

[54] VARIABLE-LENGTH DATA ALIGNMENT APPARATUS FOR DIGITAL VIDEO DATA

[75] Inventor: William B. Wilson, Singapore, Singapore

[73] Assignee: Matsushita Electric Industrial Co., Ltd., Osaka, Japan

[21] Appl. No.: 148,326

[22] Filed: Nov. 8, 1993

[30] Foreign Application Priority Data

Nov. 9, 1992 [JP] Japan .................................. 4-298733

[51] Int. Cl.$^6$ .................................................. H03M 7/40
[52] U.S. Cl. .............................. 341/67; 341/51; 341/106
[58] Field of Search .................................. 341/51, 67, 106

[56] References Cited

U.S. PATENT DOCUMENTS

| | | | |
|---|---|---|---|
| 4,092,665 | 5/1978 | Saran | 358/261 |
| 4,568,916 | 2/1986 | Bahgat | 341/67 |
| 4,744,085 | 5/1988 | Fukatsu | 371/30 |
| 4,908,862 | 3/1990 | Kaneko et al. | 380/28 |
| 5,202,886 | 4/1993 | Rossi et al. | 370/112 |
| 5,220,325 | 6/1993 | Ackland et al. | 341/67 |
| 5,245,338 | 9/1993 | Sun | 341/67 |
| 5,253,053 | 10/1993 | Chu | 358/133 |
| 5,289,577 | 2/1994 | Gonzales et al. | 395/163 |
| 5,303,058 | 4/1994 | Fukuda et al. | 358/261.1 |
| 5,392,038 | 2/1995 | Bhandari et al. | 341/67 |
| 5,404,166 | 4/1995 | Gillard et al. | 348/390 |

FOREIGN PATENT DOCUMENTS

| | | |
|---|---|---|
| 0267578 | 5/1988 | European Pat. Off. . |
| 0425834 | 5/1991 | European Pat. Off. . |
| 0482864 | 4/1992 | European Pat. Off. . |
| 0572766 | 12/1993 | European Pat. Off. . |
| 0586074 | 3/1994 | European Pat. Off. . |

OTHER PUBLICATIONS

Patent Abstracts of Japan, vol. 17, No. 9 (E-1303), Jan. 8, 1993 and Japanese document No. 04-241544.
"Recommendation H.261–Video Coder for Audiovisual Services at p×64 kbit/s," The International Telegraph and Telephone Consultative Committee, Study Group XV—Report R 37, pp. 79–107, Aug. 1990.
CD 11172-1 "Coding of Moving Pictures and Associated Audio for Digital Storage Media at up to about 1.5 Mbit/s," International Organization for Standardization, ISO MPEG Document, ISO–IEC/JTC1/SC2/WG8, 1992.
"Matsushita Algorithm for Coding of Moving Picture Information" (Proposal Description for MPEG–II), International Organization for Standardization, ISO/IEC–JTC1/SC29/WG11, MPEG91/217, Nov. 13, 1991.
"LSI Logic, L64750/51 CCITT Variable length coder/decoder," pp. 98–114.

*Primary Examiner*—Marc S. Hoff
*Attorney, Agent, or Firm*—Greenblum & Bernstein

[57] ABSTRACT

A variable-length data alignment apparatus receives header data and blocks from different sources, forms a header based on the received header data and outputs the header followed by blocks. The variable-length data alignment apparatus has a RAM for storing the header data, and a buffer for storing the blocks. A processor produces a plurality of commands and processes the header data from the RAM. The commands are prosecuted in a multiplexer and a bit stream coder to form a header and to append the blocks, stored in the buffer, after the header.

9 Claims, 6 Drawing Sheets

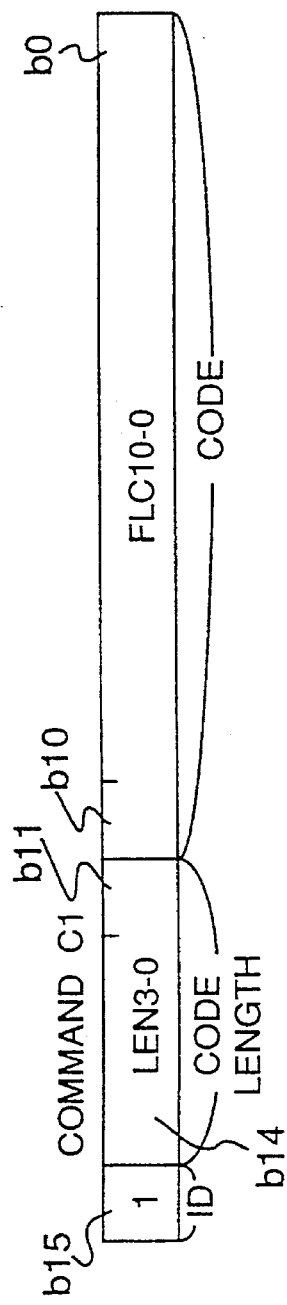
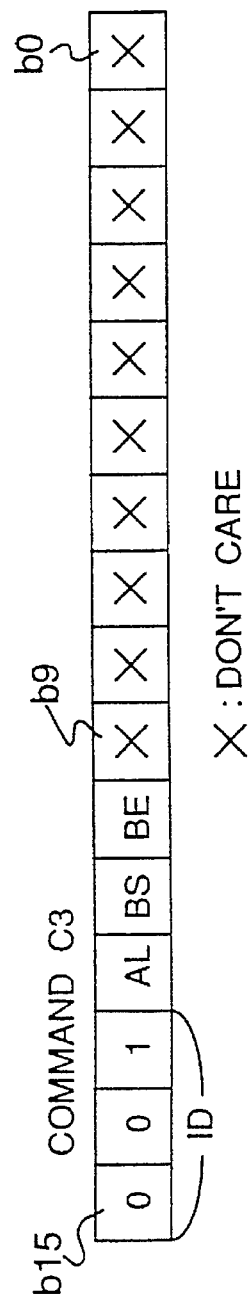
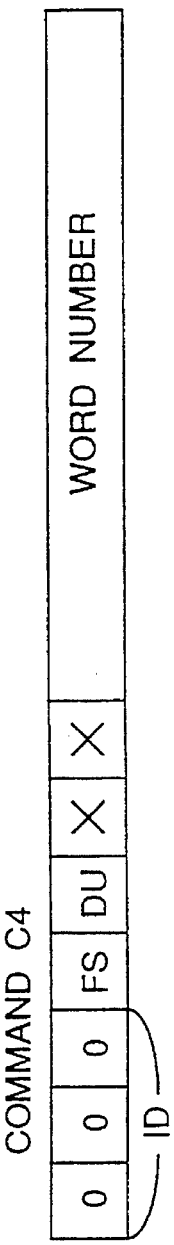
Fig.2a  Fig.2b  Fig.2c  Fig.2d

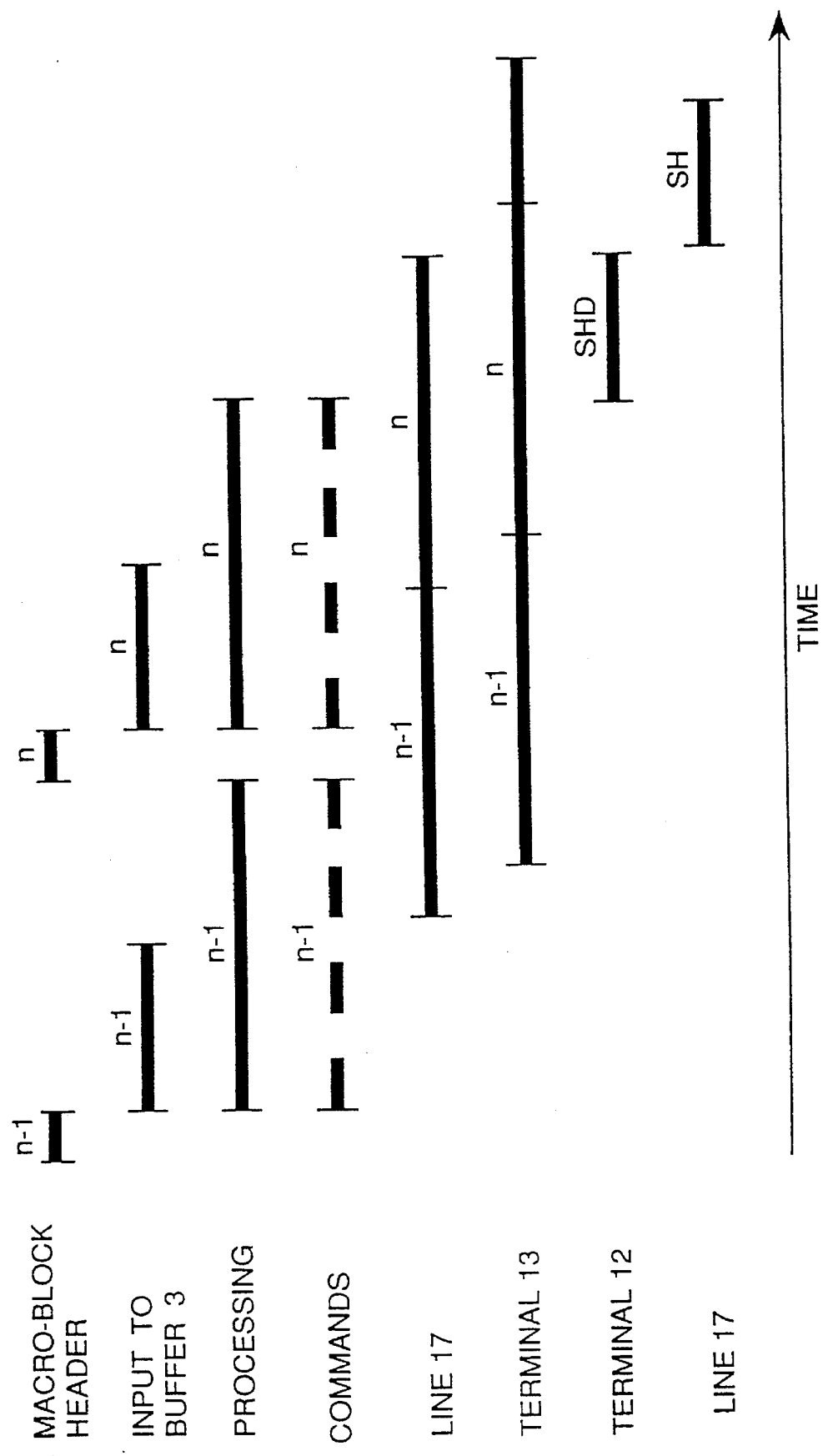

VARIABLE-LENGTH DATA ALIGNMENT APPARATUS FOR DIGITAL VIDEO DATA

BACKGROUND OF THE INVENTION

1. Field of the Invention

The present invention relates to a variable-length data alignment apparatus for generating bit sequence data used in a digital video encoder.

2. Description of the Prior Art

In digital video coding, the video signal is compressed and transferred as a bit stream of a specific syntax conforming to, for example, Recommendation H.261 ("Video Codec for Audiovisual Service at px64 kbit/s", a CCITT Subgroup XV Document in Report R37 of Study Group XV of the International Telegraph and Telephone Consultative Committee, August 1990) or MPEG-1 (ISO MPEG Document "CD 11172 —Coding of Moving Pictures and Associated Audio for Digital Storage Media at up to about 1.5 Mbps" based on ISO-IEC/JTCI/SC2/WG8, International Organization for Standardization, 1992). In these coders, coding algorithms resulting in data loss based on a discrete cosine transformation (DCT) precede lossless encoders based on variable length coding and bit stream syntax formatting. The input to a loss-free coder (known as a variable length coder or VLC) typically comprises the transform coefficient for a macro-block of video data (16×16 in MPEG-1), secondary data related to the macro-block (macro-block type, movement vectors, etc. in MPEG-1), and secondary data of the header corresponding to a slice, picture, or more fragmented part of the coded video data.

One function of the variable length coder is to convert the fixed-length in put data to variable length data. This can be achieved, for example, by run level coding the AC transform coefficient, and entropy coding various run level combinations. VLC can execute entropy coding of plural secondary data. Another VLC function is to format (reorder) the data to match the output bit stream syntax. Delta modulation and other additional coding can also be applied to a number of signals (e.g., DC coefficient and motion vectors in MPEG-1).

Existing loss-free coders support a subset of the existing standards so that there is no possibility of changing the bit stream syntax. An example of such an apparatus is LSI Logic L64750 (see LSI Logic Integrated Circuit Data Sheet L645750/51, "CCITT Variable length Coder/Decoder," April 1991, Order Number 44023), which only supports the H.261 bit stream syntax.

A versatile VLC, however, should support both existing standards (such as H.261 and MPEG-1) and new extensions to existing standards, including MPEG-2 proposed by Matsushita Electric Industrial Co., Ltd. in the ISO WG11 Document "Matsushita Proposal Description for MPEG-II" based on ISO/IEC-JTC1/SC29/WG11, MPEG91/217, International Organization for Standardization, 1991. There are, however, several problems that must be overcome in realizing such a versatile VLC.

1. Formatting is, in general extremely complex, affected by the bit stream syntax and coding algorithm and by the characteristics of the coding data.
2. Data throughput is extremely high. In the case of wide screen television sampled at 4:1:1, each macro-block must be coded in 15 microseconds. The input rate of fixed length data to the VLC exceeds 27 MHz in this case.
3. The VLC must be modular. Formatting bit stream syntaxes that are unlikely to change can be achieved by a dedicated logic circuit of minimum size. The aspects of the bitstream which are not likely to change should be implemented with minimum size dedicated logic. The aspects of the syntax which are likely to change should be implemented by versatile programmable hardware.

SUMMARY OF THE INVENTION

Therefore, the object of the present invention is to provide a digital video variable-length coder that supports an extremely high throughput rate, is modular, and the logic design of which is unaffected by syntax changes.

More specifically, one object of the present invention is to develop a VLC in which changes to the syntax do not affect the logical design of the coder. This is necessary for hardware to support ISO MPEG-2, ATV in the United States, and other future standards currently being developed.

Another object of the invention is to support extremely high data throughput rates while simultaneously enabling a programmable VLC to format the macro-blocks.

Yet another object of the invention is to provide a versatile, modular VLC that uses a fixed logic circuit for the aspects of syntaxes which will not change, and uses programmable hardware for the aspects of syntaxes that have a high probability of being changed.

To achieve these and other objects, a variable-length data alignment apparatus according to the present invention comprises a programmable syntax coder for specifying the data content and syntax of the output bit sequence, and outputting the syntax and data command, and a syntax-free coder for outputting the output bit sequence based on the syntax and data command, and is characterized by being able to program the data content and syntax order of the output bit sequence.

For example, to support the many existing bit stream syntaxes and future bit stream syntax improvements in the same hardware logic circuits, it is necessary to format the output bit stream data syntax using a programmable processor.

To achieve the extremely high data throughput rate required for digital video coders, coefficients are processed in blocks by the programmable processor rather than one by one. Because the coefficients bypass the programmable processor using a coefficient buffer, the programmable processor does not directly contribute to the time-consuming transfer of coefficient data. In addition, functions such as variable length coding using look-up tables and linking bit sequences of data code words that are very difficult to achieve in a programmable processor architecture can be achieved by means of fixed logic circuits.

Modularity can be achieved by using a programmable processor for the syntax coder and fixed logic circuits for the syntax-free coder that simply executes commands from the syntax coder. Even the most obvious changes in syntax will have no effect on the syntax-free coder logic circuit.

The syntax coder of the present invention outputs a programmable syntax and data command for specifying the data content and syntax of the output bit sequence, and the syntax-free coder of the invention outputs the output bit sequence based on the syntax and data command.

For example, the secondary information of the macro-block is transferred and processed by the programmable processor simultaneously to the time-consuming transfer of coded video coefficients to the coefficient buffer. The secondary data is transferred to the syntax-free coder in the bit stream syntax using a command specifying whether or not the data is to be variable length coded before inclusion in the bit stream,, and how the data is to be formatted in the bit stream. The coefficient block is transferred to the syntax-free coder according to a command output from the programmable processor. Higher level syntax header information is included in the bit stream by sending the data to the syntax-free coder. This data can optionally bypass the processor. The feedback parameters are determined by the syntax-free coder to control the bit transfer rate of the coded video bit stream. For example, it is possible to specify to what extent the coding parameters should be changed in order to increase or decrease the output bit transfer rate using the number of bits used for video signal coding.

The bit stream format can be programmatically determined. The programmable processor is designed to process the secondary data during the coefficient data transfer, simultaneously obtaining a high data throughput rate by using a high speed fixed logic syntax-free coder that only processes commands form the syntax coder. The fixed logic circuit of the syntax-free coder executes the functions required for syntax formatting least likely to change while the syntax coder executes the functions that are most likely to change using the programmable processor.

BRIEF DESCRIPTION OF THE DRAWINGS

The present invention will become more fully understood from the detailed description given below and the accompanying diagrams wherein:

FIGS. 2a–2d are diagrams showing the syntax and data command format of data used in the preferred embodiment, FIG. 3 is a timing chart showing macro-blocks n and n-1 following the header in the preferred embodiment.

DESCRIPTION OF PREFERRED EMBODIMENTS

Figure 1A:
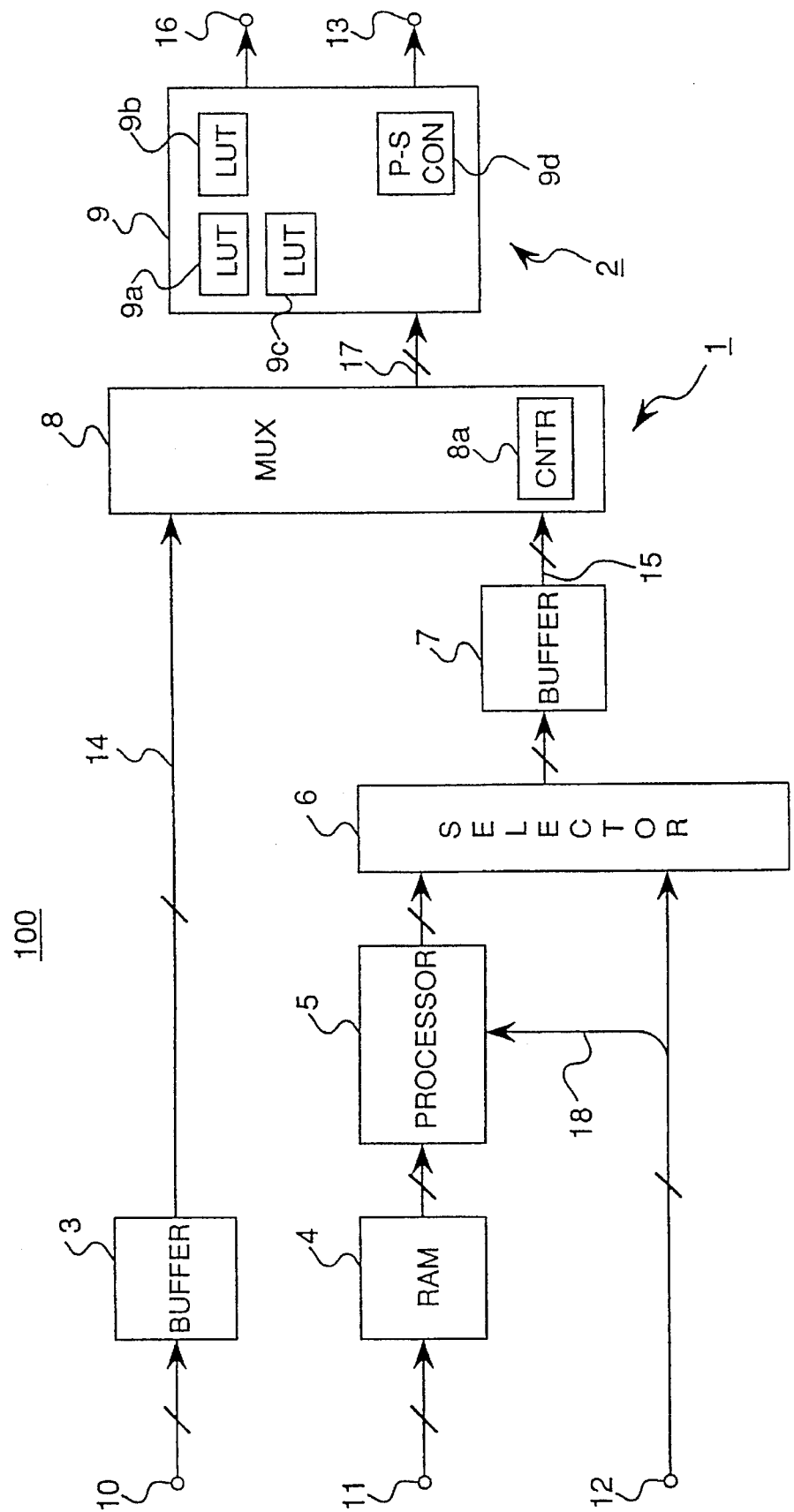
FIG. 1a is a block diagram of a variable-length data alignment apparatus according to a preferred embodiment of the present invention.

The variable-length data alignment apparatus 100 according to a preferred embodiment of the present invention is described hereinbelow with reference to the accompanying figures, of which FIG. 1a is a block diagram of the preferred embodiment, which has input terminals 10, 11 and 12, and output terminals 13 and 16.

Before the description of the detail of the diagram of FIG. 1a proceeds, the data applied to the input terminals 10, 11 and 12 and the data produced from the output terminal 13 are explained in connection with FIGS. 1b and 1c.

The digital video data is converted to a predetermined format by a discrete cosine transformation (DCT) operation to reduce the amount of digital video data and to produce a number of words of data, one word carrying one coefficient.

Figure 1B:
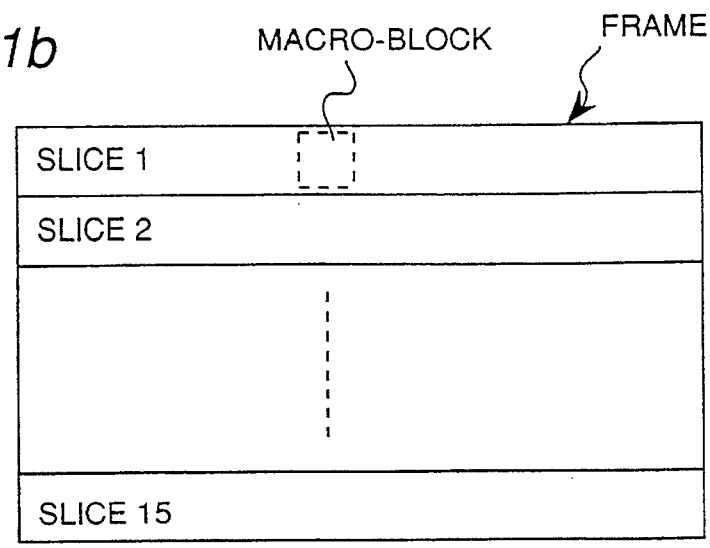
FIG. 1b is a diagrammatic view showing slice and macro-block in one frame.
Figure 1C:
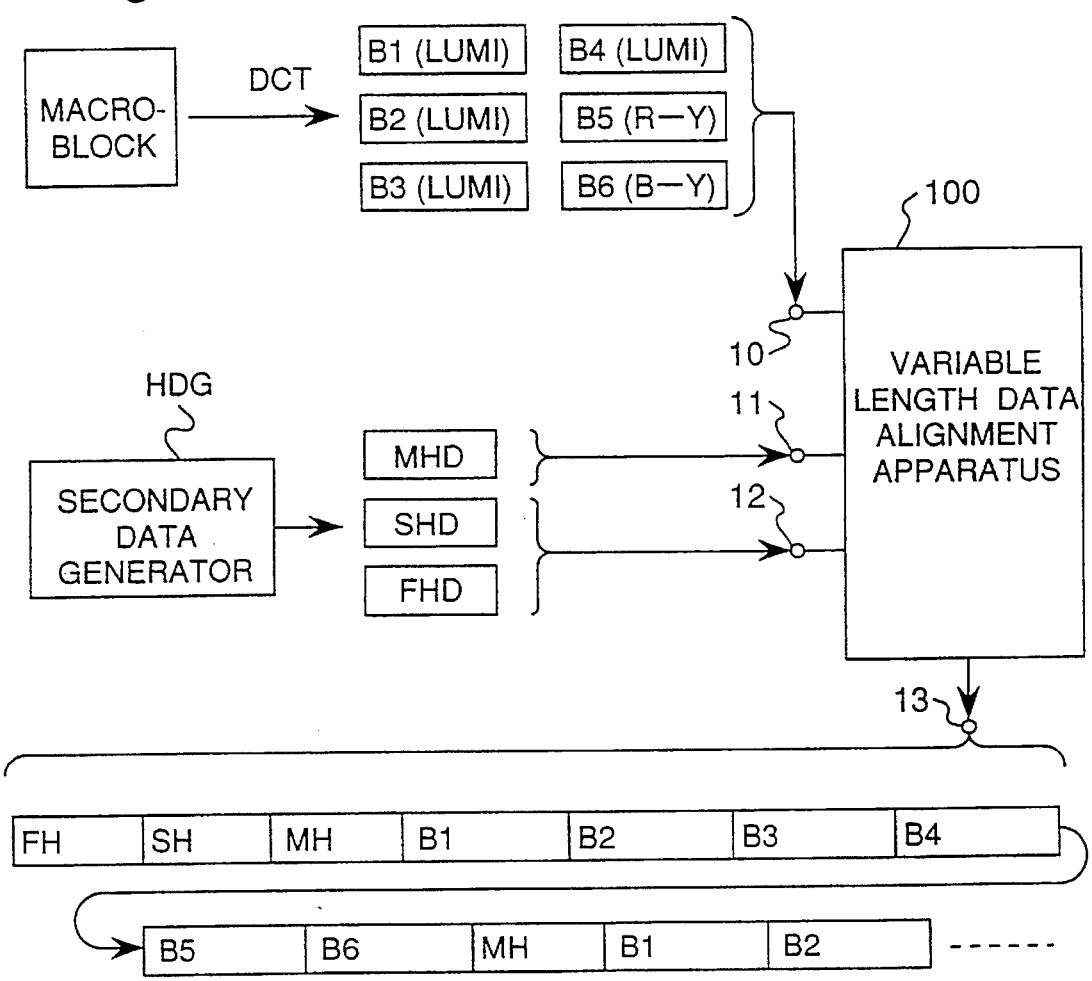
FIG. 1c is a diagrammatic view showing data arrangements before and after the variable-length data alignment apparatus.

For this purpose, as shown in FIG. 1b, the digital video data of one frame is divided into a plurality of, such as 15, horizontal sections, called slices. Each slice is further divided into a plurality of, such as 22, macro-blocks. The DCT operation is carried out by the unit of ¼ macro-block, and the result of the DCT operation of one macro-block produces, e.g., six blocks B1–B6 of bit sequence data, as diagrammatically shown in FIG. 1c. Of the six blocks, blocks B1–B4 carry luminance data and blocks B5 and B6 carry color difference data R-Y and B-Y. Each block contains 64 words, i.e., 64 coefficients. The blocks B1–B6 are generated after one macro-block DCT operation and are applied to terminal 10 of the variable length data alignment apparatus 100.

During the generation of the blocks B1–B6 repeatedly, a secondary data generator HDG generates secondary data, such as macro-block header data MHD, slice header data SHD and frame header data FHD. In the present embodiment, for the purpose of description only, it is assumed that macro-block header data MHD includes macro-block position data, a look-up table number data, a look-up table address data, and a macro-block pattern data. The look-up table number data and a look-up table address data are used for obtaining a variable length code (VLC) of a macroblock type. The macro-block header data MHD is generated after the generation of every six blocks B1–B6; the slice header data SHD is generated after the generation of every 132 blocks (6×22=132); and the frame header data FHD is generated after the generation of every 1980 blocks (6×22×15=1980). The macro-block header data MHD is applied to terminal 11 of the variable length data alignment apparatus 100, and the slice header data SHD and the frame header data FHD are applied to terminal 12 of the same.

In the variable length data alignment apparatus 100, the six blocks B1–B6 from one macro-block are aligned serially; a macro-block header MH, formed by the use of the macro-block header data MHD, is inserted in front of each group of six blocks B1–B6 defining a macro-block; a slice header SH, formed by the use of the slice header data SHD, is inserted in front of every 132 blocks, defining a slice; and a frame header FH, formed by the use of the frame header data FHD, is inserted in front of every 1980 blocks, defining a frame.

Referring back to FIG. 1a, the variable length data alignment apparatus 100 comprises a syntax coder 1 and a syntax-free coder 2 connected to the syntax coder 1.

The syntax coder 1 comprises a coefficient buffer 3 in which the blocks B1–B6 are temporarily stored, a macro-block header data RAM 4, a programmable processor 5, a selector 6, a command buffer 7, and a multiplexing logic circuit 8.

The programmable syntax coder 1 supports a hierarchical syntax as defined in the above description for video signal coding. The syntax coder 1 has three input terminals 10, 11 and 12, to which the supplied data are: coefficient data; macro-block header data MHD; and higher level header data, such as slice header data SHD and frame header data FHD. The higher level header bypass data can be input to the programmable processor 5, or can be input directly to the command buffer 7 bypassing the programmable processor 5, as shown in FIG. 1a. The header data can thus be multiplexed with other data before being input to the syntax-free VLC.

The macro-block header data RAM 4 is previously divided into a number of rooms for temporarily storing various data. According to the above example, RAM 4 receives data from the input terminal 11 and has four rooms for separately storing the received four different data, which are the macro-block position data, the look-up table number data, the look-up table address data, and the macro-block pattern data. The coefficient buffer 3 and command buffer 7 may use a FIFO (first-in, first-out) design but are not limited thereto. The programmable processor 5 may similarly be a microprocessor or digital signal processor (DSP), but is not limited thereto.

The selector 6 is so arranged that whenever a slice header data SHD or a frame header data FHD is applied from terminal 12, selector 6 closes the line from processor 5 and transmits the header data SHD or FHD to buffer 7 and further to multiplexer 8. When a slice header data SHD or a frame header data FHD is applied to terminal 12, an ID data indicative of the header data SHD or FHD is applied to processor 5 through line 18. Thus the processor 5 may start a new routine for processing data in a new slice or in a new frame.

The multiplexing logic circuit 8 selects either the words (coefficients) from line 14 or the data command from line 15. The multiplexing logic circuit 8 has a counter 8a for counting the number of words (coefficients) that has passed through the multiplexing logic circuit 8 from line 14. Also, the multiplexing logic circuit 8 cuts off the already used command data from line 15, in a manner which will be described later.

The syntax-free coder 2 comprises a bit stream coder 9 including a plurality of, such as three, look-up tables 9a, 9b and 9c and a parallel-serial converter 9d. The bit stream coder 9 processes the commands and data, and outputs the coded data bit stream through terminal 13 and also outputs rate control parameters through terminal 16. The rate control parameters 16 can also be sent back to the syntax coder 1.

While the coefficient data 10 is being input to the coefficient buffer 3, the programmable processor 5 begins processing the macro-block header data 11 and outputs the syntax and data command to the command buffer 7 through the selector 6. The syntax and commands used in this embodiment are shown in FIGS. 2a, 2b, 2c and 2d.

Referring to FIG. 2a, a bypass command C1 is shown for carrying a variable length code. Command C1, as well as other commands, has a total length of 16 bits. In bypass command C1, the most significant bit b15 carries an identification bit (1) indicating bypass command C1; the eleven least significant bits b10–b0 are for "FLC bypass" command, and are used for carrying a variable length code filled in from the least significant bit position; and the four mid bits b14–b11 is used for carrying code length data indicative of the length of the variable length code carried in some or all of the bits b0–b10.

Referring to FIG. 2b, a VLC command C2 is shown for carrying data related to a look-up table. In VLC command C2, the most significant two bits b15–b14 carry an identification bit (01) indicating VLC command C2; the next three bits b13–b11 are used for carrying the look-up table number for designating one of the three look-up tables 9a, 9b and 9c; and the remaining eleven bits b10–b0 are used for carrying the look-up table address.

Referring to FIG. 2c, a start/stop command C3 is shown for carrying data for controlling start and stop of the block data transmission through multiplexer 8. In start/stop command C3, the most significant three bits b15–b13 carry an identification bit (001) indicating start/stop command C3; the next bit b12 is an alignment flag "AL" for aligning the byte boundary and the next bit sequence in the bit stream; the next two bits b11 and b10 are start and stop flags "BS" and "BE" indicating the start and end of the coefficient block, respectively. The remaining bits b9–b0 are any arbitrary bits provided merely to occupy the empty space.

Referring to FIG. 2d, a counter command C4 is shown for carrying data for controlling counter 8a provided in the multiplexer 8. In counter command C4, the most significant three bits b15–b13 carry an identification bit (000) indicating counter command C4; the next bit b12 is a flag "FS" for start selecting the words (coefficients) from buffer 3; the next bit b11 is a flag "DU" for indicating the dumping of the words; and the bits b8–b0 are for carrying number of words (coefficients) in one block. According to the above example, there are 64 words (coefficients) in one block, so bits b8–b0 carry a number "64".

The coefficient block is processed, for example, by converting to a run level for variable length coding according to the syntax specifications of MPEG-1 and H.261. It should be noted that the sequence of the data commands input to the bit stream coder 9 is the same as the sequence of the bit stream syntax.

It should be noted that the commands shown in FIG. 2 are limited only by this embodiment, and are not limited by the present invention. Other commands that may be required by the preferred bit stream syntax or coder functionality can be included in this format. In addition, the content of each command can be changed to comply with various conditions. For example, a look-up table (LUT) is used in this embodiment for conversions to the variable length code corresponding to the fixed length data. This is accomplished by using the address determined by the programmable processor 5 to access the look-up table. Note that this approach is not a condition of the present invention.

In this embodiment, the multiplexing logic circuit 8 must handle time-based multiplexing of the coefficient data and the syntax and data command to output commands and data to the bit stream coder 9 (via line 17) in the bit stream output sequence specified by the syntax and data command. Commands that do not match the "coefficient" command pass through the multiplexing logic circuit 8 and are input to the bit stream coder 9. If not, the number of coefficients specified by the command are input to the bit stream coder 9 or are deleted/ignored (as are "uncoded" coefficient blocks in MPEG-1). The header data and coefficient data are combined in the sequence specified by the syntax through these commands. Because the command sequence is controlled by the microprocessor, the bit stream syntax can be programmed.

It is to be noted that the multiplexing logic circuit 8 of this embodiment is specific to this embodiment, but the present invention shall not be limited thereto. It is not necessary for the multiplexing logic circuit 8 to be comprised as described above. For example, the multiplexing logic circuit 8 can be provided internally to the bit stream coder 9. In this case, the bit stream coder 9 processes the commands, and directly reads the coefficients specified by the commands.

FIG. 3 is a time chart of this embodiment showing the timing for macro-blocks n and n-1. The programmable processor 5 begins macro-block processing immediately after all macro-block header data, such as macro-block position data, look-up table number data, look-up table address data, and macro-block pattern data are stored in the macro-block header data RAM 4 before all coefficient data is transferred to the coefficient buffer 3. Output of the syntax and data command occurs during macro-block processing. When the syntax-free coder 2 becomes usable, it immediately reads the commands and begins processing. The output bit stream corresponding to the command is output after a short processing delay affected by syntax-free coder 2 operation. The header information is output as a bit stream to the syntax-free coder 2 at an interval determined by the bit stream syntax. The sequence of the coefficient data input to the coefficient buffer 3 must be the sequence required by the output bit stream syntax, though the specific sequence itself is not important.

Figure 4:
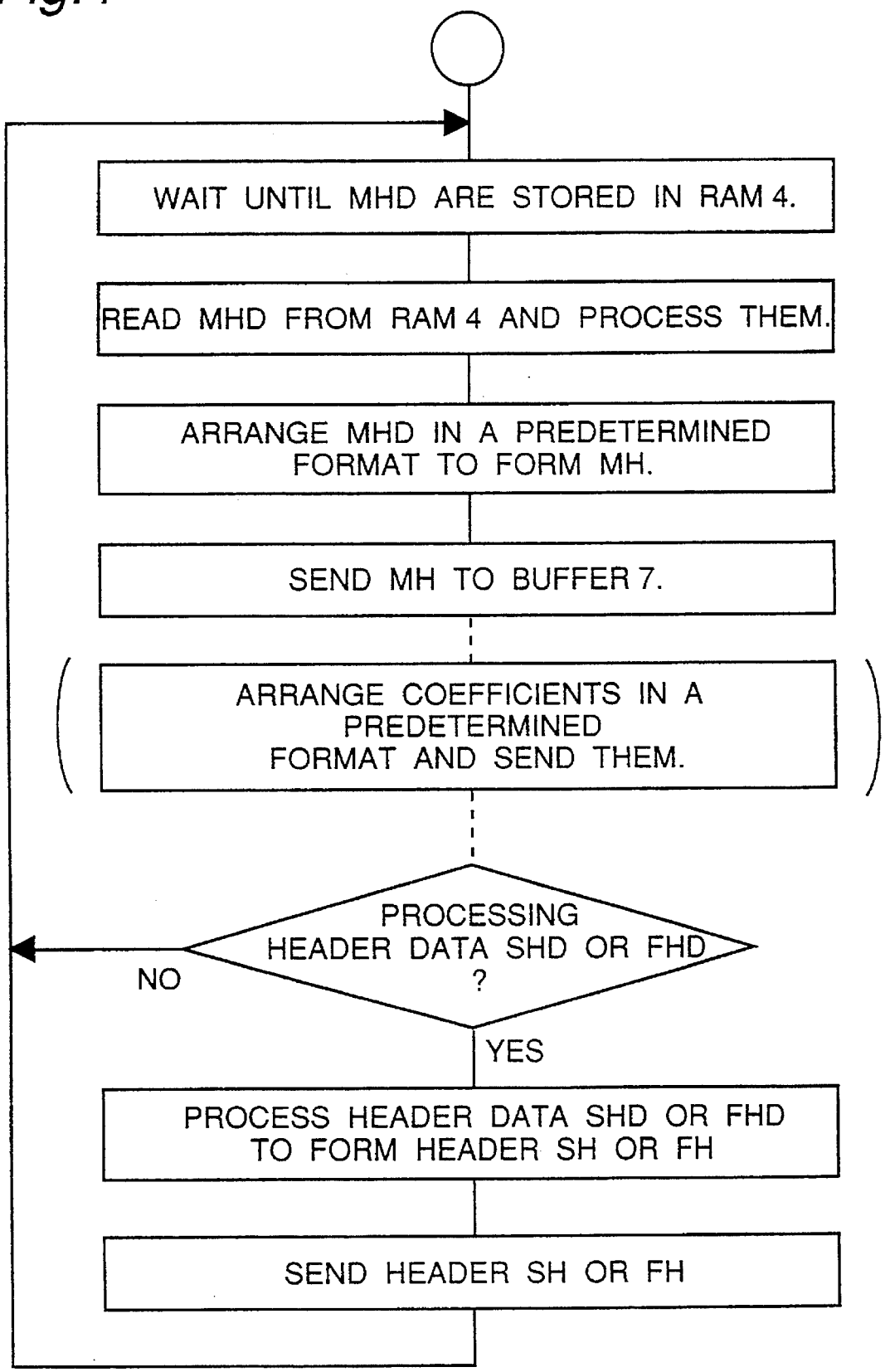
FIG. 4 is a flow chart showing the functions of the programmable processor in the preferred embodiment.

FIG. 4 is a flow chart of programmable processor 5 operation. When macro-block header data is received, the programmable processor 5 begins processing and formatting the syntax and data command, and starts outputting to the command buffer 7. Processing is executed according to the syntax. In the case of MPEG-1, for example, movement vector differentiation and skip macro-block evaluation can be included in the processing operation, but the invention shall not be so limited. Command formatting includes rearranging the data forming the macro-block to the syntax order, specifying what data is in a fixed length bit sequence, is a variable length bit sequence that must be variable length coded before insertion to the bit stream, or is coefficient data to be processed as a block. When the header data must follow the data forming the macro-block, this header data must be input to the command buffer 7 as the syntax and data command. For example, in MPEG-1, slice headers occur with relative frequency, and can be formatted by the programmable processor 5. Likewise, the programmable processor 5 can execute the rate control calculation using the rate control parameters 16 output from the syntax-free coder 2, though this is not absolutely essential.

Figure 5:
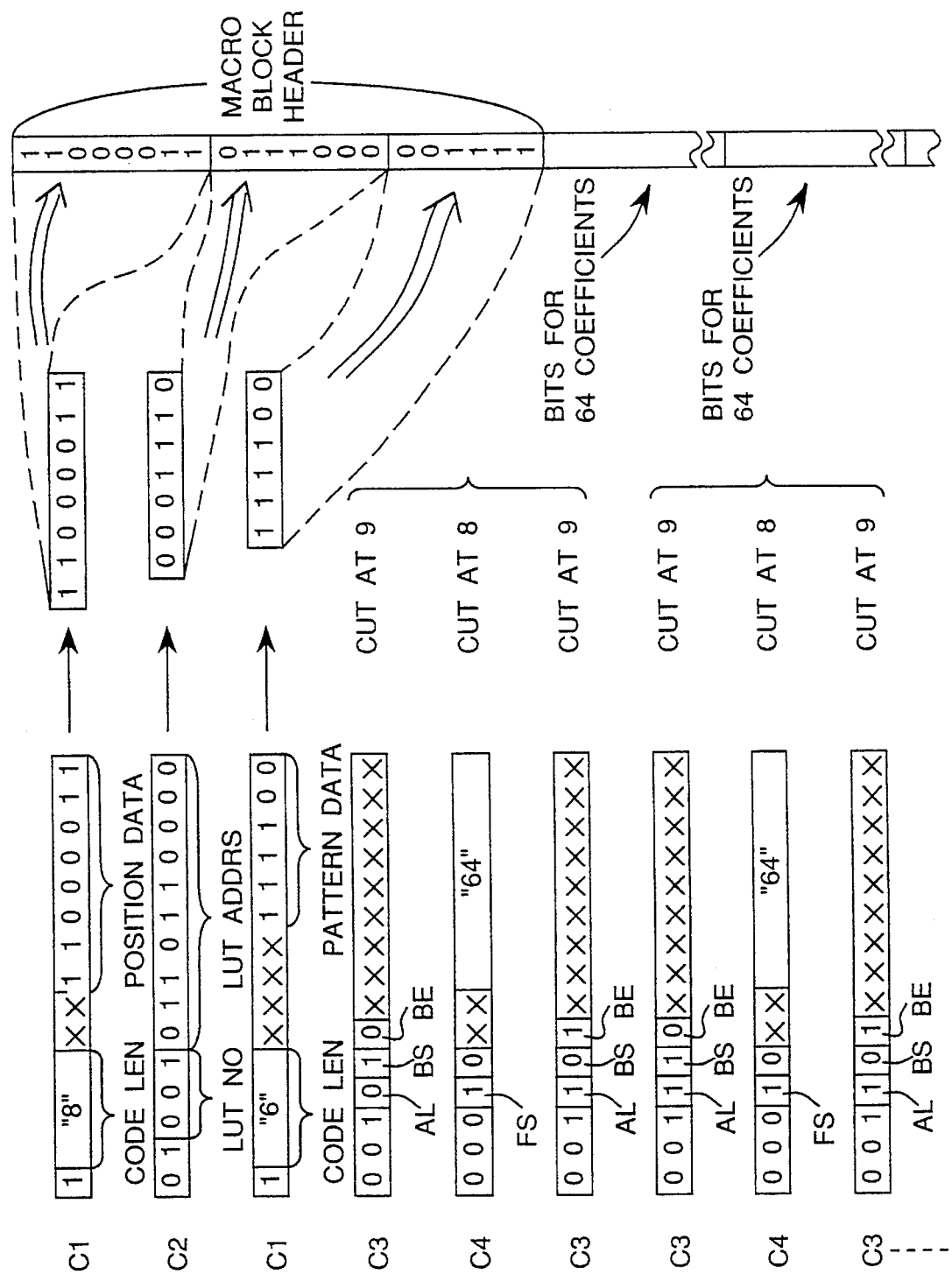
FIG. 5 is a diagram showing specific alignment of commands used in the programmable processor.

Referring to FIG. 5, an example of a specific operation according to one program installed in the programmable processor 5 is shown. The programmable processor 5 is previously programmed to produce, in response to a completion of generation of one slice header, commands C1, C2 and C1 to produce a macro-block header MH, and commands C3, C4 and C3 to produce a block B1. The commands C3, C4, C3 are repeated six times, i.e., until the next slice header is provided, to send six block B1–B6.

First, command C1 is used to send an 8-bit long position data (11 000 011). Thus, in command C1, "8" is carried in the code length and the position data (11 000 011) is carried in least significant bits. In the bit stream coder 9, the most significant bit portion (b15–b8) of command C1 is cut off, and the remaining bit portion (b7–b0) is applied to the parallel-serial converter 9d.

Then, command C2 is used to send a look-up table number data and a look-up table address data. It is assumed that in RAM 4, (001) is stored for the look-up table number and (0 110 110 000) is stored for the look-up table address. These two data are used to form the command C2, as shown in FIG. 5. When the command C2 is applied to bit stream coder 9, the look-up table 9a having a look-up table number (001) is accessed and a data stored in the address (0 110 110 000) is read. According to the example shown in FIG. 5, the read data is (0 001 110) which is a variable length code (VLC) for a macroblock type. In the bit stream coder 9, the entire command C2 is cut off, and the data read from the look-up table is applied to the parallel-serial converter 9d.

Next, command C1 is again used to send a pattern data (111 100). Thus, in command C1, "6" is carried in the code length and the position data (111 100) is carried in least significant bits. In the bit stream coder 9, the most significant bit portion (b15–b6) of command C1 is cut off, and the remaining bits (b5–b0) are applied to the parallel-serial converter 9d.

The data obtained in response to commands C1, C2 and C1 as explained above are serially produced from terminal 13 defining a macro-block header, as shown in FIG. 5.

Thereafter, command C3 is used to indicate that the transmission of a new block will be started. In the bit stream coder 9, the entire command C3 is cut off.

Then, command C4 is used to reset counter 8a in the multiplexer 8 to "64", and to enable multiplexer 8 to transmit 64 words (coefficients) from line 14. The command C4 itself is cut off at the multiplexer 8.

After command C4, coefficients are transmitted from line 14, through multiplexer 8 and bit stream coder 9, to output terminal 13. Each time coefficient transmits the multiplexer 8, counter 8a is decreased by one. When counter 8a counts down to zero, multiplexer 8 is reset to transmit commands from line 15.

Then, command C3 is again used to indicate that the transmission of one block has been completed. In the bit stream coder 9, the entire command C3 is cut off.

In this manner, a command set of commands C3, C4 and C3 is repeated six times to send six blocks B1–B6.

Although not shown in FIG. 5, it is possible to align output data to a byte boundary by setting the command C3 AL bit.

According to the present invention as described above, coding conforming to existing standards is possible while the apparatus can also be programmed to sufficiently support future developments in video coding technology. Because a large volume of coefficient data bypasses the microprocessor, the microprocessor does not waste valuable time transferring coefficients and can be used to format data according to the syntax specifications. The hardware logic circuit has a fairly generic interface between a programmable syntax coder and a syntax-free fixed logic coder, and is therefore simple and modular. The circuit size is small enough to be included in the video coding IC device.

By using a microprocessor for syntax formatting, this architecture can support H.261, MPEG-1, MPEG-2 as proposed by Matsushita, and recognized modifications to these algorithms. As a result, this architecture is ideal for multiple standard video coders used in algorithm research.

As will be obvious from the above description, the present invention comprises a programmable syntax coder outputting the syntax and data command for specifying the data content and signal of the output bit sequence, and a syntax-free coder for outputting the output bit sequence based on the syntax and data command. As a result, the invention can support an extremely high data throughput rate, and can be realized in a modular design whereby the logic design of the coder is unaffected by syntax changes.

The invention being thus described, it will be obvious that the same may be varied in many ways. Such variations are not to be regarded as a departure from the spirit and scope of the invention, and all such specifications as would be obvious to one skilled in the art are intended to be included within the scope of the following claims.

What is claimed is:

1. A variable-length data alignment apparatus for digital video data comprising:

programmable syntax coding means for specifying data content and syntax of an output bit sequence, and outputting a syntax and data command; and syntax-free coding means for outputting said output bit sequence based on said syntax and data command, whereby data content and syntax order of said output bit sequence can be programmed.

2. A variable-length data alignment apparatus for receiving header data and blocks and for aligning header followed by blocks, said variable-length data alignment apparatus comprising:

first memory means for storing said header data;

second memory means for storing said blocks;

processing means for producing a plurality of commands and for processing said header data from said first memory means;

command prosecution mean for prosecuting the commands to form a header and to append said blocks, from said second memory means, after said header.

3. A variable-length data alignment apparatus as claimed in claim 2, wherein said command prosecution means comprises:

multiplexing means for receiving commands from said processing means and blocks from said second memory means, selectively transmitting either one of said command and block; and bit stream coding means for forming a bit stream of header and blocks.

4. A variable-length data alignment apparatus as claimed in claim 3, wherein said multiplexing means comprises a counter for counting a number of words passing through said multiplexing means.

5. A variable-length data alignment apparatus as claimed in claim 4, wherein said commands comprises a counter command for carrying data for controlling said counter.

6. A variable-length data alignment apparatus as claimed in claim 3, wherein said bit stream coding means comprises a look-up table.

7. A variable-length data alignment apparatus as claimed in claim 5, wherein said commands comprises a variable length code command for carrying access data for accessing said look-up table.

8. A variable-length data alignment apparatus as claimed in claim 3, wherein said commands comprises a bypass command for carrying data which is outputted from said command prosecution means as a part of said header.

9. A variable-length data alignment apparatus as claimed in claim 3, wherein said commands comprises a start/stop command for controlling said multiplexing means.

\* \* \* \* \*